United States Patent
Vicard et al.

(10) Patent No.: US 8,093,617 B2
(45) Date of Patent: Jan. 10, 2012

(54) BARE MICROELECTRONIC CHIP PROVIDED WITH A RECESS FORMING A HOUSING FOR A WIRE ELEMENT CONSTITUTING A FLEXIBLE MECHANICAL SUPPORT, FABRICATION PROCESS AND MICROSTRUCTURE

(75) Inventors: Dominique Vicard, Saint Nazaire les Eymes (FR); Bruno Mourey, Coublevie (FR); Jean Brun, Champagnier (FR)

(73) Assignee: Commissariat à l'Energie Atomique, Paris (FR)

( * ) Notice: Subject to any disclaimer, the term of this patent is extended or adjusted under 35 U.S.C. 154(b) by 185 days.

(21) Appl. No.: 12/310,246

(22) PCT Filed: Jun. 21, 2007

(86) PCT No.: PCT/FR2007/001034
§ 371 (c)(1),
(2), (4) Date: Feb. 18, 2009

(87) PCT Pub. No.: WO2008/025889
PCT Pub. Date: Mar. 6, 2008

(65) Prior Publication Data
US 2009/0200066 A1    Aug. 13, 2009

(30) Foreign Application Priority Data
Aug. 29, 2006 (FR) .................... 06 07588

(51) Int. Cl.
*H01L 33/00* (2010.01)
(52) U.S. Cl. .......... 257/99; 257/466; 257/618; 257/698; 257/730; 257/E21.555; 257/E23.124
(58) Field of Classification Search .......... 257/99, 257/466, 618, 698, 730, E21.555, E23.124
See application file for complete search history.

(56) References Cited

U.S. PATENT DOCUMENTS

| | | |
|---|---|---|
| 6,646,336 B1 | 11/2003 | Marmaropoulos et al. |
| 2003/0082851 A1 | 5/2003 | Van Hoff |
| 2003/0211797 A1 | 11/2003 | Hill et al. |
| 2005/0112798 A1* | 5/2005 | Bjorbell .................. 438/106 |
| 2005/0277307 A1 | 12/2005 | Zollo et al. |
| 2006/0175697 A1 | 8/2006 | Kurosawa et al. |
| 2006/0278997 A1* | 12/2006 | Gibson et al. ............. 257/778 |
| 2008/0001241 A1* | 1/2008 | Tuckerman et al. ........ 257/434 |

FOREIGN PATENT DOCUMENTS

| | | |
|---|---|---|
| JP | A 2003-86762 | 3/2003 |
| JP | A 2003-163313 | 6/2003 |

* cited by examiner

*Primary Examiner* — Andy Huynh
(74) *Attorney, Agent, or Firm* — Oliff & Berridge, PLC

(57) ABSTRACT

A microelectronic chip comprises two parallel main faces and side faces. At least one of the faces comprises a recess provided with at least one electrical connection element and forming a housing for a wire element. The wire element simultaneously constitutes both an electrical connection between the chip and the outside via said connection element and a flexible mechanical support for said chip.

17 Claims, 6 Drawing Sheets

BARE MICROELECTRONIC CHIP PROVIDED WITH A RECESS FORMING A HOUSING FOR A WIRE ELEMENT CONSTITUTING A FLEXIBLE MECHANICAL SUPPORT, FABRICATION PROCESS AND MICROSTRUCTURE

BACKGROUND OF THE INVENTION

The invention relates to a microelectronic chip comprising two parallel main faces and side faces.

The invention also relates to a fabrication method of such a microelectronic chip and to a microstructure comprising at least two chips connected by a wire element.

STATE OF THE ART

At present a large number of applications require manufacture of fabrics providing electronic functions, called active textiles. For example thermo-electric fabrics generate energy from a temperature gradient, piezoelectric fabrics are able to supply electronics by recovering motion energy. This energy then supplies an electronic circuit integral to the fabric.

Two techniques for manufacturing such textiles are currently used. In one of these, the electronic functions are obtained by adding electronic circuits to the textiles. For example, the electronic functions are performed by a microelectronic chip conventionally connected to other chips or to a power supply by means of pads connected to solderable mechanical elements by means of connecting wires, a casing protecting the circuit and pads. The electronic functions able to be performed can be complex, but the mechanical stability of the electronic chip integrated in the textile is very poor. Such an integration is long and requires complex special machines.

Furthermore, the connections occupy a non-negligible space compared with that of the active part of the chip.

In the other manufacturing technique, that is still experimental, the electronics are printed on the textile, the latter acting as support. Generally these support textiles are obtained by conventional weaving. However the complexity of the electronic functions able to be achieved by these techniques is very limited and much lower than that which can be attained with microelectronic chips.

OBJECT OF THE INVENTION

The object of the invention consists in producing a microelectronic chip presenting improved integration in a fabric.

According to the invention, this object is achieved by the appended claims and more particularly by the fact that at least one of the faces of the chip comprises a recess provided with at least one electrical connection element and forming a housing for a wire element, which at the same time constitutes an electrical connection between the chip and the outside via said connection element and a flexible mechanical support for said chip.

It is a further object of the invention to provide a method for fabricating a microelectronic chip in which the recess is formed by a groove situated on at least one side face.

A development of the invention is a microstructure comprising a wire element electrically and mechanically connecting at least two chips according to the invention.

BRIEF DESCRIPTION OF THE DRAWINGS

Other advantages and features will become more clearly apparent from the following description of particular embodiments of the invention given for non-restrictive example purposes only and represented in the accompanying drawings, in which.

DESCRIPTION OF PREFERRED EMBODIMENTS OF THE INVENTION

Figure 1:
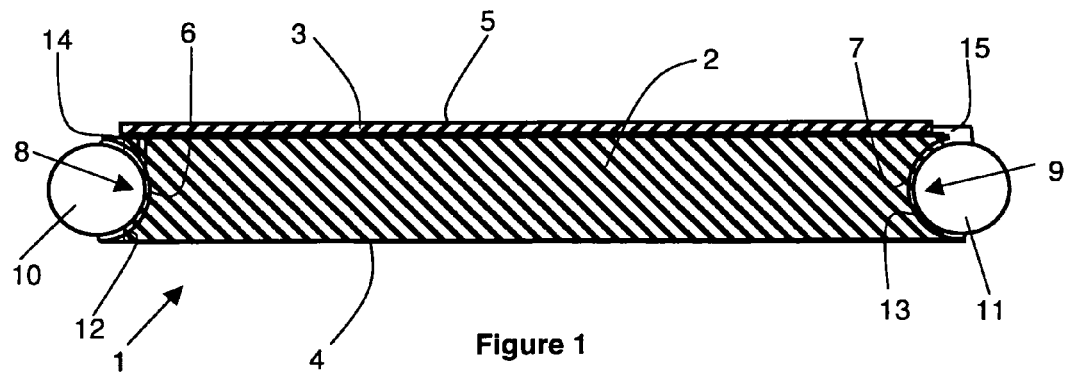
FIG. 1 is a cross sectional view of a first example embodiment of a microelectronic chip according to the invention.

In FIG. 1, a first example of a microelectronic chip 1 comprises a flat substrate 2 equipped in conventional manner with at least one microelectronic component 3. Microelectronic chip 1 thus has two main faces 4 and 5 parallel to one another, connected by side faces forming the edge of chip 1. Only two side faces 6, 7 are represented, but their number can vary and depends on the shape of the outline of main faces 4, 5.

As illustrated in FIG. 1, each side face 6, 7 is in the form of a trough parallel to main faces 4 and 5 and constitutes a groove, respectively referenced 8 and 9 for side faces 6, 7 and enabling a wire element to be housed. Housing grooves 8, 9 each present a concave cross section. In the particular embodiment illustrated in FIG. 1, the width of grooves 8, 9 is equal to the height of side faces 6, 7 and their cross section is in the form of an arc of a circle, i.e. C-shaped. The C-shape can be exact or approximate with segments of straight lines.

Grooves 8 and 9 can be produced by any suitable technique, such as for example by dry or wet etching, laser ablation, laser-assisted chemical etching, mechanical machining and so forth.

Microelectronic chip 1 can thus be easily integrated in a textile since two adjacent wire threads 10, 11, for example of a weft (a filling thread), constituting this textile can be automatically inserted in housing grooves 8, 9, whether it be by means of a weaving process or a knitting process. Housing grooves 8, 9 ensure the mechanical stability of microelectronic chip 1 with respect to the textile. It is clear that it will be attempted to adapt the radius of curvature of housing grooves 8, 9 to the diameter of threads 10, 11. Similar grooves can be envisaged for warp threads.

As an alternative, grooves 8, 9 can be coated with an electrically conducting layer, respectively 12, 13. This arrangement enables electrically conducting weft or warp threads 10, 11 to be used ensuring electrical contact with these threads 10, 11. The threads can then be used for electrical supply of the microelectronic component 3 and may also be used for data transfer with power supply/data multiplexing. The threads can also constitute radiating antenna elements (transmission or receipt). The electrically conducting layers 12, 13 can be electrically connected in conventional manner to microelectronic component 3 by means of a pass through via 14 perpendicular to main faces 4, 5 or by means of a conducting track 15 deposited on the surface of substrate 2 equipped with component 3 to connect layer 13 to a contact of component 3.

In an alternative embodiment, housing grooves 8, 9 can have a V-shaped or a truncated V-shaped cross section. In the latter case, each groove 8, 9 comprises two convergent walls joined to one another by a flat bottom.

Figure 2:
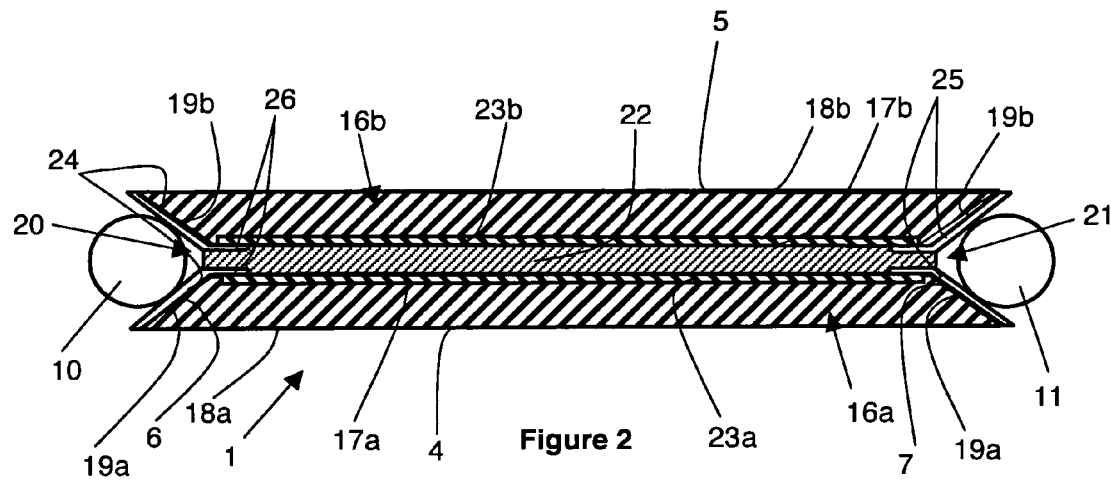
FIG. 2 is a cross sectional view of a second example embodiment of a microelectronic chip according to the invention.

In the embodiment illustrated in FIG. 2, microelectronic chip 1 is formed by two elemental chips 16a and 16b of substantially trapezoid cross section, each comprising a small base, 17a or 17b and a large base, 18a or 18b joined to one another by inclined flat side faces 19a or 19b. For each of elemental chips 16a, 16b, inclined flat side faces, 19a or 19b form an acute angle with corresponding large base, 18a or 18b, and are convergent. A microelectronic component 23a, 23b is situated at the level of small base 17 (respectively 17a, 17b) of each of elemental chips 16a, 16b. Elemental chips 16a, 16b are secured via their small bases 17a, 17b in such a way that their inclined side faces 19a, 19b form at least one housing groove. In FIG. 2, two housing grooves 20 and 21 are represented. Housing grooves 20, 21 therefore present a V-shaped cross section (more particularly a truncated V-shaped cross section in FIG. 2) and constitute side faces 6 and 7 of microelectronic chip 1. Large bases 18a, 18b are parallel and form main faces 5, 6 of microelectronic chip 1 of FIG. 2. Housing grooves 20, 21 can accommodate threads 10 and 11 in the same way as microelectronic chip 1 of FIG. 1.

Elemental chips 16a and 16b are for example assembled to one another by gluing, a layer of adhesive 22 then being provided between small bases 17a, 17b. The adhesive can be a resin, either insulating, conducting or electroactive. When this assembly is performed, by depositing the resins selectively, electrical connections between the microelectronic components 23a, 23b and/or pressure sensor or energy generation (piezoelectric) functions can be achieved by means of electroactive resin insertions. Assembly of elemental chips 16a, 16b can also be performed by molecular bonding. In the latter case, layer of adhesive 22 is absent.

Housing grooves 20, 21 are coated with an electrically conducting layer, respectively 24, 25, deposited on inclined flat side faces 19a, 19b. This arrangement enables weft or warp threads 10, 11 that are electrically conducting to be used and ensures an electrical contact with these threads 10, 11. The electrically conducting layers 24, 25 are electrically connected in conventional manner to microelectronic components 23a, 23b, for example by means of conducting tracks 26. Tracks 26 can be made from the same material as layers 24, 25, possibly during deposition of layers 24, 25.

In the case where gluing is achieved by an electroactive polymer resin (which enables a local energy source to be constituted), layers 24, 25 can be eliminated. If not, threads 10, 11 can be assigned to electronic functions different from power supply and layers 24, 25 are assigned to other functions than power supply.

As an alternative, microelectronic components 23a, 23b can be formed at the level of large bases 18a, 18b. Such a component can then be electrically connected with an electrically conducting layer 24, 25 by means of a pass-through via (not represented in FIG. 2).

Figure 3:
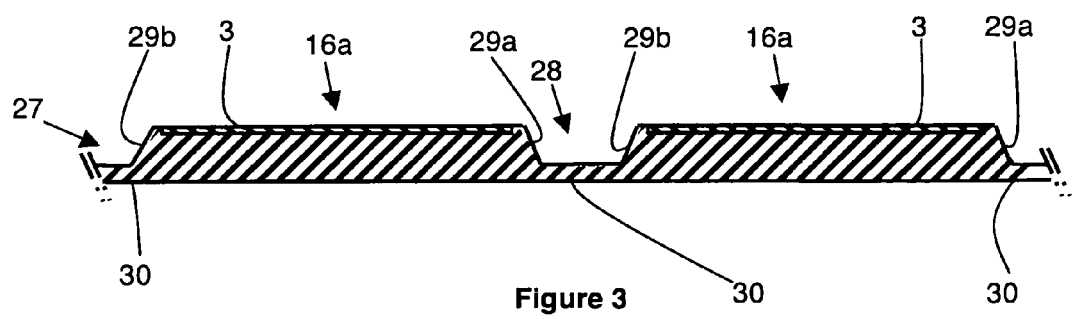
FIGS. 3 to 5 illustrate the different steps of a fabrication method of the chip according to FIG. 2.
Figure 4:
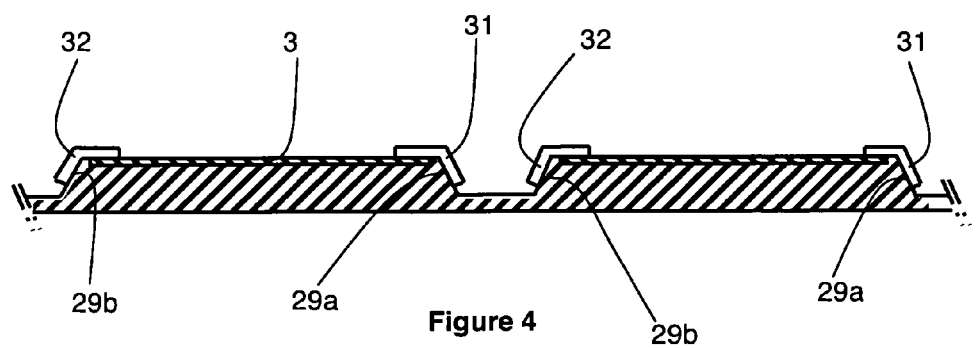
Figure 5:
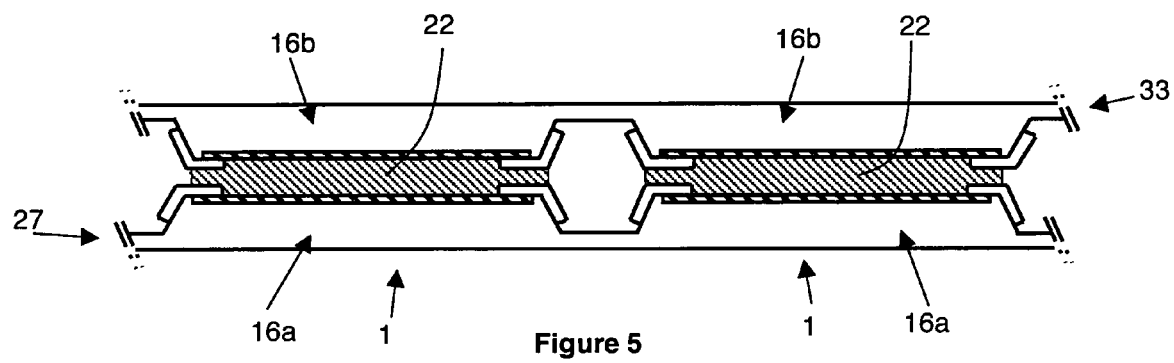

Microelectronic chip 1 of FIG. 2 can be obtained by the fabrication method illustrated in FIGS. 3 to 5. In a first step (FIG. 3), a plurality of elemental chips 16a separated by V-shaped grooves 28 each comprising two convergent walls 29a, 29b are fabricated simultaneously on one and the same first wafer 27. Each groove 28 is formed in the surface of wafer 27 in which small bases 17 are formed. Walls 29a, 29b of grooves 28 are connected via a flat bottom 30, parallel to the surface of wafer 27 in which small bases 17 are formed. Two networks of parallel grooves 28 are made. Grooves 28 of the two networks are orthogonal to one another. In this way, a pair of adjacent grooves 28 of one of the networks, in combination with the pair of adjacent grooves 28 of the other network, delineates a small base 17 of rectangular or square shape. Elemental chips 16a are arranged in lines and columns in the plane of wafer 27. A microelectronic component is formed at the level of each of small bases 17. FIG. 3 illustrates, in cross section, two adjacent elemental chips 16a separated by a groove 28. A second similar wafer 33 (represented in FIG. 5) comprises a plurality of elemental chips 16b.

In the next step (FIG. 4), an electrically conducting material is deposited on the surface of wafer 27 in which small bases 17 are formed so as to form, in each elemental chip 16a, a first contact 31 arranged between microelectronic component 3 and wall 29a of an adjacent groove 28, and a second contact 32 arranged between component 3 and wall 29b of parallel adjacent groove 28. Such contacts (not represented) can also be achieved for the walls of grooves 28 of the perpendicular network.

In a subsequent step (FIG. 5), wafer 27 comprising elemental chips 16a is bonded to wafer 33 comprising elemental chips 16b. Wafers 27 and 33 are bonded via their faces comprising grooves 28 so that grooves 28 are superposed. The assembly achieved in this way comprises a plurality of microelectronic chips 1 according to FIG. 2. These microelectronic chips 1 are arranged in rows and columns separated from one another by flat bottoms 30 of grooves 28 of wafers 27 and 33. For each microelectronic chip 1, the material used for bonding constitutes adhesive layer 22 of FIG. 2. Assembly of wafers 27 and 33 can also be performed by molecular bonding. In the latter case, adhesive layers 22 are absent. Planing of the rear faces (opposite the faces where grooves 28 are formed) of wafers 27, 33 can be optionally performed to thin microelectronic chips 1 formed in this way.

In a last step, wafers 27, 33 bonded to one another are cut at the level of grooves 28 so as to separate microelectronic chips 1 from one another. This cutting can be performed by any suitable technique, for example by sawing with a circular diamond saw, by dry or wet etching, by laser ablation, laser-assisted chemical etching, and so forth.

Figure 6:
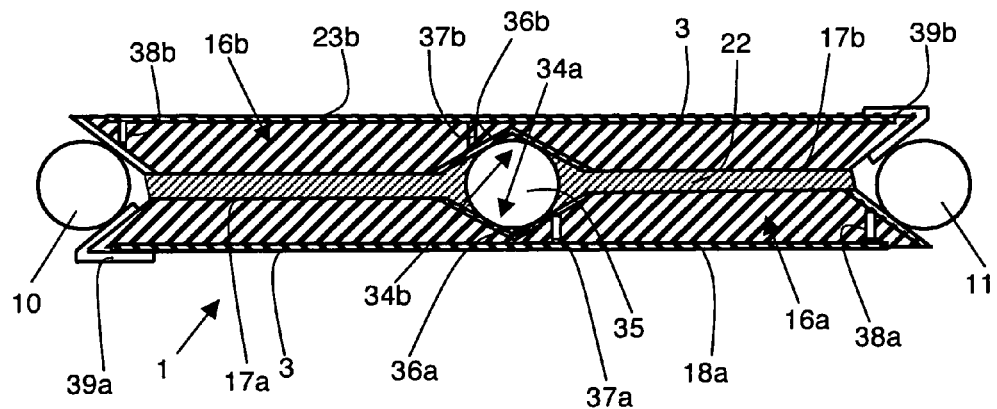
FIG. 6 represents a cross sectional view of an alternative embodiment of fabrication of a chip according to FIG. 2, FIGS. 7 and 8 illustrate two other embodiments of fabrication of a chip according to the invention.

FIG. 6 illustrates an alternative embodiment of chip 1 according to FIG. 2. In this alternative embodiment, microelectronic components 23a, 23b of elemental chips 16a, 16b are formed at the level of large bases 18a, 18b. Small base 17a, 17b of each of elemental chips 16a 16b comprises an additional groove 34a, 34b parallel to V-shaped housing grooves 20, 21. Additional grooves 34a, 34b are superposed to form an additional housing for a wire element, such as a wire 35 inserted between threads 10 and 11. Additional grooves 34a, 34b are coated with an electrically conducting layer, respectively 36a, 36b, connected to electronic component 23a or 23b, associated by means of a via, 37a or 37b.

On account of the arrangement of microelectronic components 23a, 23b, the latter can, as before, be connected to electrically conducting layers 24, 25 by a via 38a, 38b or by a conducting track 39a, 39b.

Wire 35 can be designed to perform direct interconnection between two microelectronic chips 1 or to constitute an antenna by radiating metal wire. Wire 35 can also be a piezoelectric fiber so as to constitute the power supply.

In all the alternative embodiments that have just been described in the above, the contact between threads and wires 10, 11, 35 and housing grooves 8, 9, 20, 21 and additional grooves 34a, 34b can be improved by resorting to a conducting adhesive for example with two components which reticulates or polymerizes when the two components are in contact. Wires and threads 10, 11, 35 are then coated with one of the components whereas the other component is deposited in grooves 8, 9, 20, 21, 34a, 34b.

The wire element can be secured by any other means, for example by soldering by adding material, by plasma, electrolysis, ultrasonic welding and so forth.

In another embodiment of the invention, microelectronic chip 1 comprises at least one recess 8, 9, i.e. a groove or a hole, in one of its main faces 4, 5. This enables it to be integrated, for example in a textile, in a mode called parallel, i.e. the axis of wire element 10, 11 in the immediate vicinity of its fixing to the chip is substantially parallel to main faces 4, 5 of microelectronic chip 1.

Figure 7:
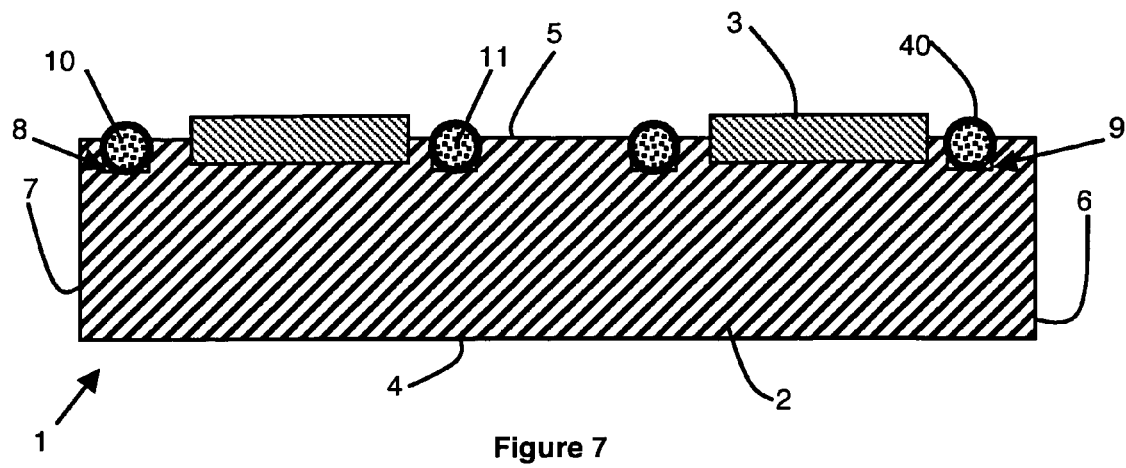

As illustrated in FIG. 7, a microelectronic chip 1 comprising a flat substrate 2, for example made of silicon, is provided with at least one microelectronic component 3. Chip 1 comprises at least one recess 8, 9, for example a trench or a non-through hole, made either on a front face 5, i.e. on the face comprising microelectronic components 3, or on a rear face 4, substantially parallel to the front face. These recesses 8, 9 serve the purpose of providing a mechanical connection between chip 1 and wire element 10, 11 to which chip 1 is to be fixed. The shape and dimensions of recess 8, 9 depend on the mechanical and dimensional characteristics of wire element 10, 11. For example, a groove presenting a concave cross section, for example a square or circular, V-shaped or truncated V-shaped cross section, can be used.

In a preferred embodiment, to ensure that chip 1 is well secured to wire elements 10, 11 belonging for example to a fabric on which the chip is to be integrated, a fixing compound, for example an adhesive, can be used.

Fixing by clamping at least one wire element 10, 11 in recesses 8, 9 of chip 1 ensures a rigid mechanical connection between the chip and the wire element at chip level. A wire element then forms a flexible mechanical connection between two chips that are attached thereto.

The chip preferably presents a conducting surface, within recess 8, 9, forming an electrical connection element. Wire element 10, 11, forming a flexible mechanical support for chip 1, then at the same time constitutes an electrical connection between chip 1 and the outside. In this way, microelectronic components 3 of chip 1, electrically connected to wire element 10, 11, are then able to be electrically supplied and/or to communicate with other chips 1 also mechanically and electrically connected to wire element 10, 11.

As an alternative embodiment, wire element 10, 11 can be used by chip 1 as communication antenna (transmission and/or receipt).

In conventional manner, a plurality of microelectronic chips 1 are made simultaneously on a substrate 2. At least one recess 8, 9 is made on each chip 1 to be able to clamp a wire element 10, 11 therein.

Recesses 8, 9, for example in the form of grooves, can be achieved by chemical etching, for example by means of a KOH solution, or by plasma etching or by sawing. The choice of the dimensions of groove 8, 9 is made according to the characteristics of wire element 10, 11 to be integrated in groove 8, 9 to ensure the best possible mechanical strength. The depth and width of the groove can typically vary between 20 µm and 100 µm for integration of a wire element with a diameter of about 20 µm to 100 µm in the groove. Moreover, the flanks of the grooves can be thinned so as give them a flexibility enabling wire element to be clamped by force. Thinning is achieved for example by means of two notches formed on each side of the recess and illustrated in FIG. 15 in another embodiment.

The depth of groove 8, 9 can be
- either smaller than or equal to the diameter of the wire element so as to leave it flush with the surface,
- or larger than or equal thereto so as to obtain a greater flexibility of the flanks for clamping.

In the case where grooves 8, 9 are formed on front face 5, they are made in microelectronic components 3 or in proximity thereto (FIG. 7). In the latter case, recesses 8, 9 are electrically connected to microelectronic component 3 of the chip for electrical communication of chip 1 with the outside. The electrical connection between microelectronic component 3 and a recess 8, 9 is made in conventional manner by any suitable means, for example by fabricating a metal track by ink jet, screen printing or use of a conducting adhesive.

A wire element 10, 11, for example belonging to a fabric, is then clamped, preferably forcibly, in groove 8, 9. When wire element 10, 11 has to perform electrical communication with microelectronic chip 1, any contact of the conducting material of wire element 10, 11 with undesired areas of microelectronic chip 1 has to be avoided. In the case of use of a wire element made from conducting material, the latter can advantageously be coated by an insulating material 40 (FIG. 7).

In the case where wire element 10, 11 is made from conducting material and does not comprise any insulating material coating, electrical insulation from the bottom of recess 8, 9 can be performed in known manner. Furthermore, if layer of insulating material 40 coating wire element 10, 11 is made from thermosetting polymer, hot insertion is then preferably chosen for ease of clamping and gluing of wire element 10, 11 inside groove 8, 9, and therefore of insertion thereof for example in a fabric.

Figure 8:
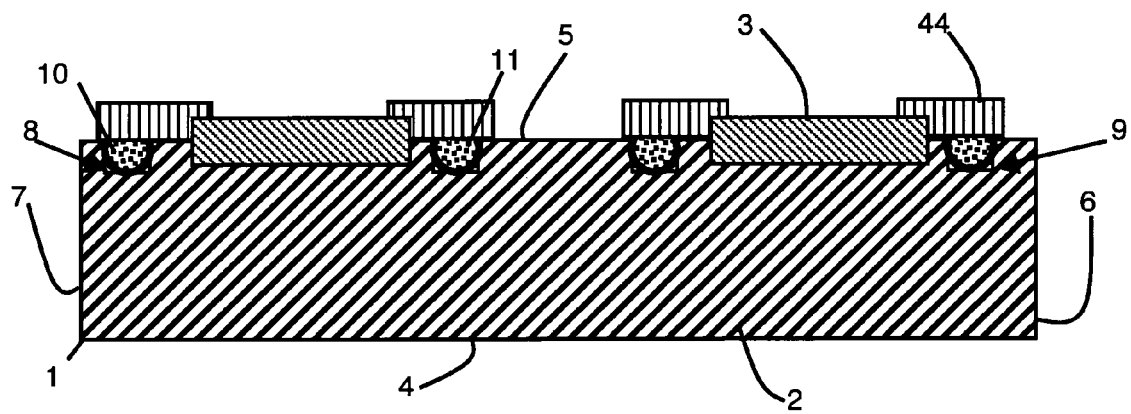

In the alternative embodiment illustrated in FIG. 8, the coating of wire element 10, 11 is partially eliminated after the wire element has been inserted in corresponding groove to enable electrical connection to be made between the wire element and microelectronic component 3 of chip 1. Removal of layer of insulating material 40 is performed by any known means, for example by scraping with a blade or by hot creeping during or after clamping. Connection with component 3 is then performed by formation of a metal track 44 covering the bared part of the wire element and connecting it to a connection pad (not represented) of component 3. Such a track can conventionally be obtained by ink jet, screen printing or deposition of a conductive adhesive.

Figure 9:
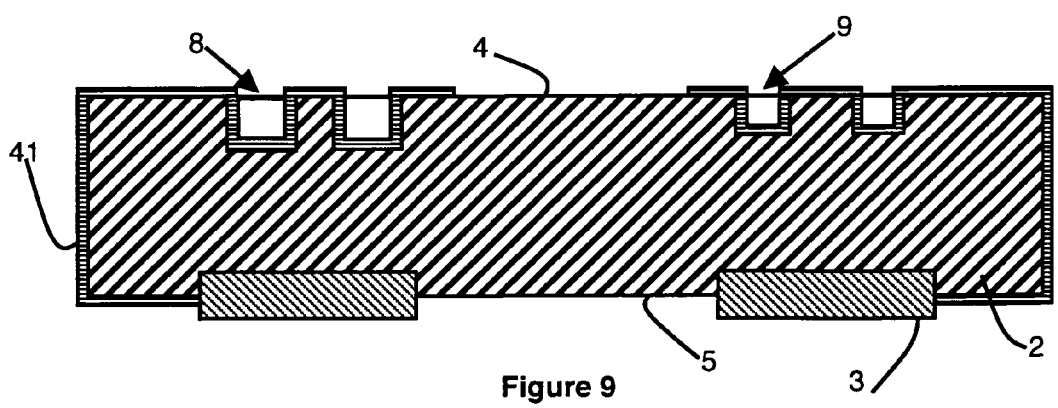
FIGS. 9 and 10 illustrate another embodiment of a fabrication method of a chip according to the invention.
Figure 10:
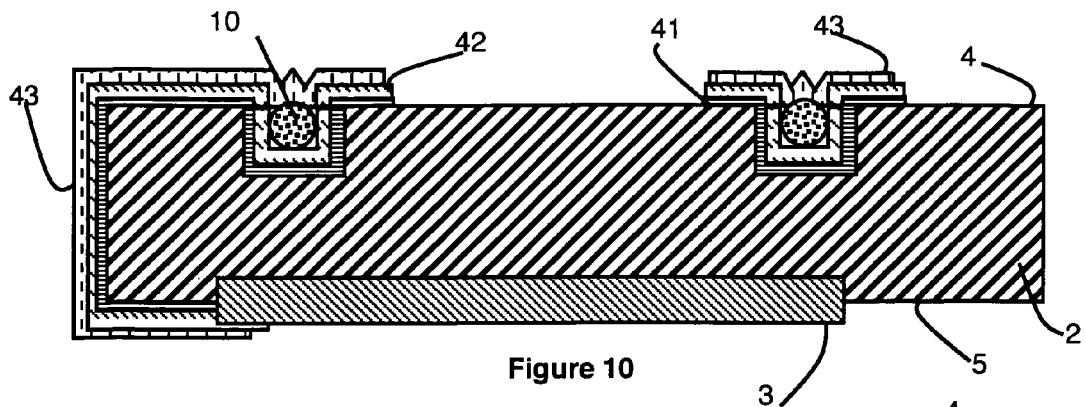

In another alternative embodiment illustrated in FIGS. 9 and 10, integration of grooves 8, 9 is performed in rear face 4. In this way, the surface of front face 5, called "active" face is preserved and a higher integration density can then be obtained by distributing the different functionalities of chip 1 over main faces 4, 5. If a plurality of wire elements 10, 11 are to be used as electrical conductors, it is advantageous to use integration on rear face 4. It is in fact then possible to integrate a larger number of wire elements using the rear face, for example 9 or 10 wires per mm with parallel wires spaced 80 µm apart.

Wire element 10, 11 disposed in a recess 8, 9 situated on rear face 4 is advantageously made of conducting material and preferably not provided with a coating of insulating material. An electrical contact is made within microelectronic chip 1 to enable connection of wire element 10, 11 made of conducting material situated on rear face 4 and microelectronic component 3 situated on front face 5. In this way, recess 8, 9 forms a housing for a wire element that simultaneously constitutes an electrical connection between the chip and the outside while at the same time acting as flexible mechanical support for chip 1.

In the embodiment illustrated in FIG. 9, after at least one recess 8, 9 has been made in rear face 4, a layer of insulating material 41 is first of all deposited on the substrate and then patterned to electrically insulate at least recesses 8, 9 and future conducting tracks for connection to component 3 from substrate 2. Insulating material 41 is for example silicon nitride or silicon oxide with a thickness of typically about 100 to 500 nm.

Then (FIG. 10), a conducting material 42 is deposited on layer 41 to make an electrical connection between the microelectronic component and the inside of the groove. Conducting material 42 is for example formed by stacking 30 nm of Titanium covered by 300 nm of Copper. Conventionally, this conducting material is also patterned to prevent any short-circuits.

Wire elements 10, 11 can then be inserted in recesses 8, 9 to integrate microelectronic chip 1 for example within a fabric. Advantageously, a reinforcing metal 43 can be deposited, for example by electrolysis, after wire elements 10, 11 have been inserted. Reinforcing metal 43 is preferably formed by a layer of nickel or copper with a thickness typically comprised between 2 and 30 µm. This step not only improves the connection between components 3 of front face 5 and wire elements 10, 11 of rear face 4, but also enables wire element 10, 11 to be secured or soldered in its housing.

Figure 11:
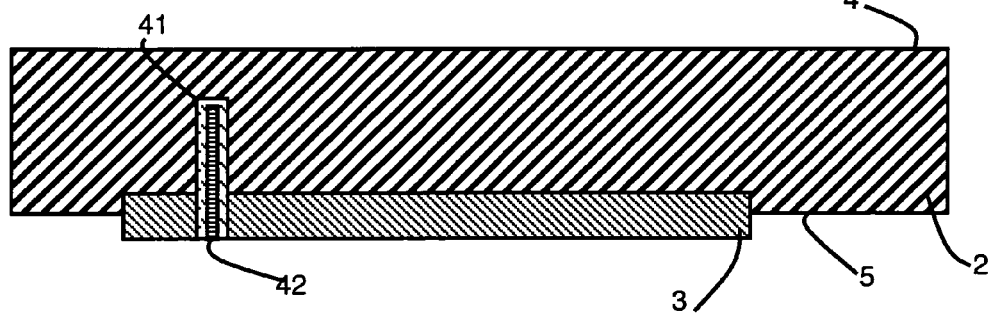
FIGS. 11 to 13 illustrate another embodiment of a fabrication method of a chip according to the invention.
Figure 12:
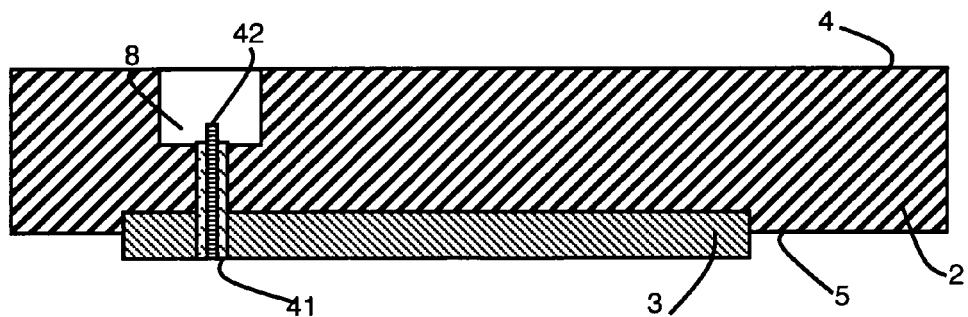
Figure 13:
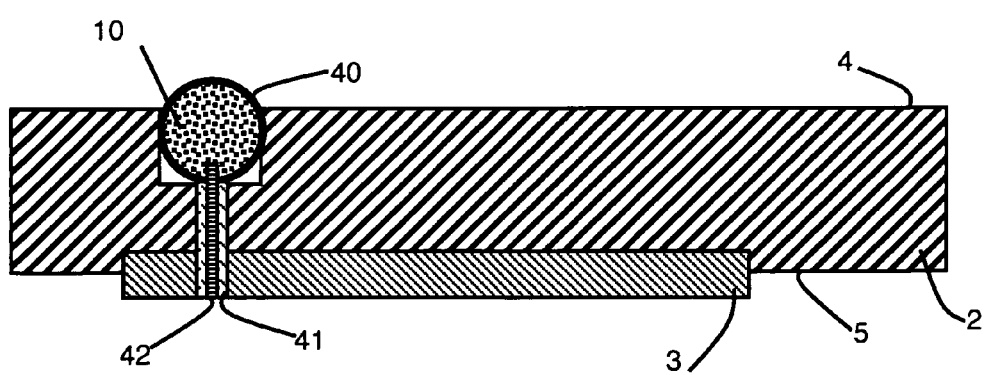

Another method for fabricating a chip wherein the grooves are formed at the level of the rear face is illustrated in FIGS. 11 to 13.

As illustrated in FIG. 11, a cavity, advantageously a hole, is etched in microelectronic chip 1 from front face 5 and penetrates into the substrate.

The depth of the hole is preferably comprised between 100 and 200 µm. The hole has a typical diameter of about 100 µm and can advantageously be terminated by a pointed shape. The hole achieved in this way is then coated, by any suitable technique, with an insulating material 41, for example a PECVD silicon oxide, having a thickness comprised for example between 100 and 300 nm. Then a preferably hard conducting material 42, for example nickel or tungsten, fills the cavity covered in this way. Conducting material 42 thus formed is connected to microelectronic component 3.

As illustrated in FIG. 12, a recess 8, for example a groove, starting off from rear face 4, is then etched opposite the hole. Groove 8 is advantageously wider than the hole. The depth of groove 8 is advantageously defined such that conducting material 42 coming from the front face is salient at the bottom of groove 8, preferably by a height of 10 to 20 µm, thereby forming a tip. Groove 8 is made by means of any suitable technique, for example by selective etching of the dielectric material of substrate 2 with respect to insulating material 41.

The layer of insulating material 41 salient from the bottom of groove 8 is then removed by any known method, for example by plasma etching or by wet etching.

As illustrated in FIG. 13, a wire element 10, for example made from conducting material advantageously coated with a layer of insulating material 40, is then inserted in groove 8 in order to integrate microelectronic chip 1 within a flexible structure. Insulating film 40 coating the conducting material can for example be a varnish or a thermoplastic polymer. When wire element 10 is inserted in groove 8, the salient conducting material part 42 in the form of a tip, coming from front face 5, perforates insulating film 40 coating wire element 10 and thereby makes the electrical contact of the latter with microelectronic component 3.

If the insulator 40 coating wire element 10 is a thermosetting polymer, the wire is preferably inserted hot to facilitate indentation of the tip of conducting material 42 in the wire element and to make the latter adhere inside groove 8.

Figure 14:
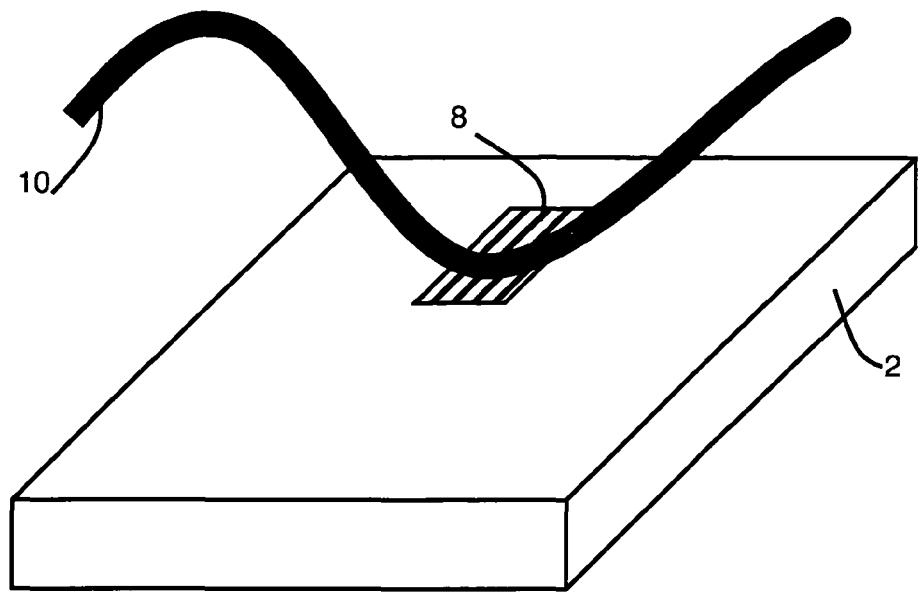
FIGS. 14 to 17 illustrate a chip according to the invention, wherein the wire element is perpendicular to the main faces of the chip.

In an alternative embodiment, illustrated in FIG. 14, the recess is a non pass-through hole 8 made on one of main faces 4, 5 in order to clamp a wire element 10 therein.

In another embodiment called perpendicular, the axis of wire element 10 is perpendicular to main faces 4, 5 of microelectronic chip 1 when the chip is clamped in the flexible structure such as a fabric.

Figure 15:
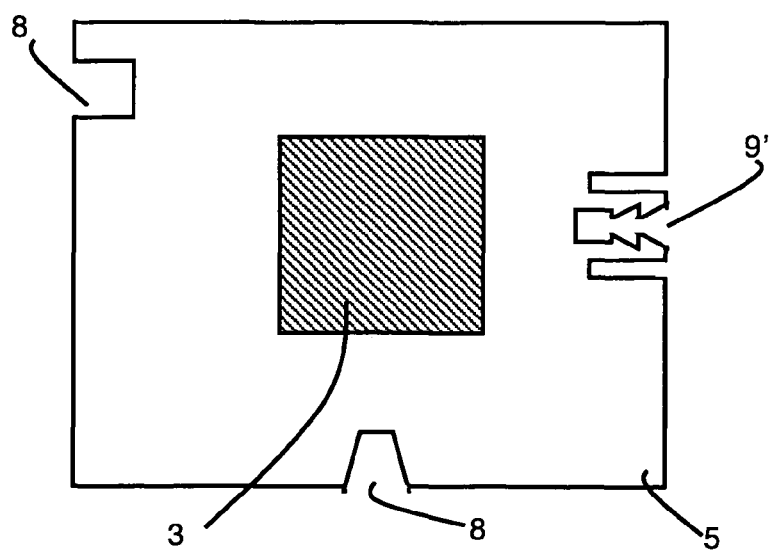

In this embodiment, illustrated in top view in FIG. 15, at least one pass-through recess 8, 9', for example a via, is made in a microelectronic chip 1, preferably at the periphery of the chip. This via 8, 9' can be obtained by any known means, for example by plasma etching or by laser. The hollowed part of chip 1 can for example be square, V-shaped or C-shaped or present (via 9') a structure having the purpose of mechanically securing (wire grip) a wire element 10. The inside walls of via 9' are not smooth but present sharp tips, for example the side faces of the grooves comprise claws designed to lacerate the insulating sheath of the wire element when the latter is inserted in via 9' and to secure the wire element.

In the alternative embodiment illustrated in FIG. 15, two notches are made in proximity to recess 9' on each side of the latter to give the recess the necessary flexibility to withstand the stresses during insertion of wire element 10 and/or the heat expansion variations between wire element 10 and chip 1.

Figure 16:
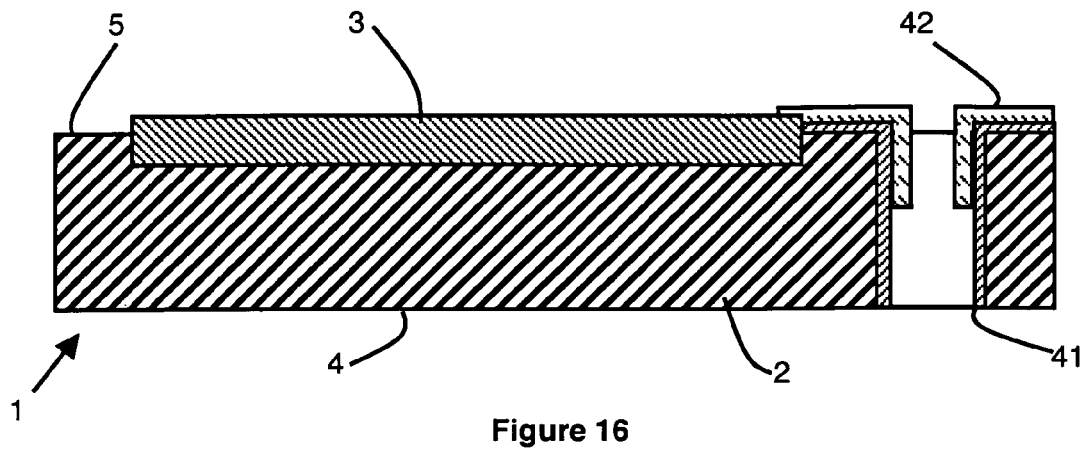
Figure 17:
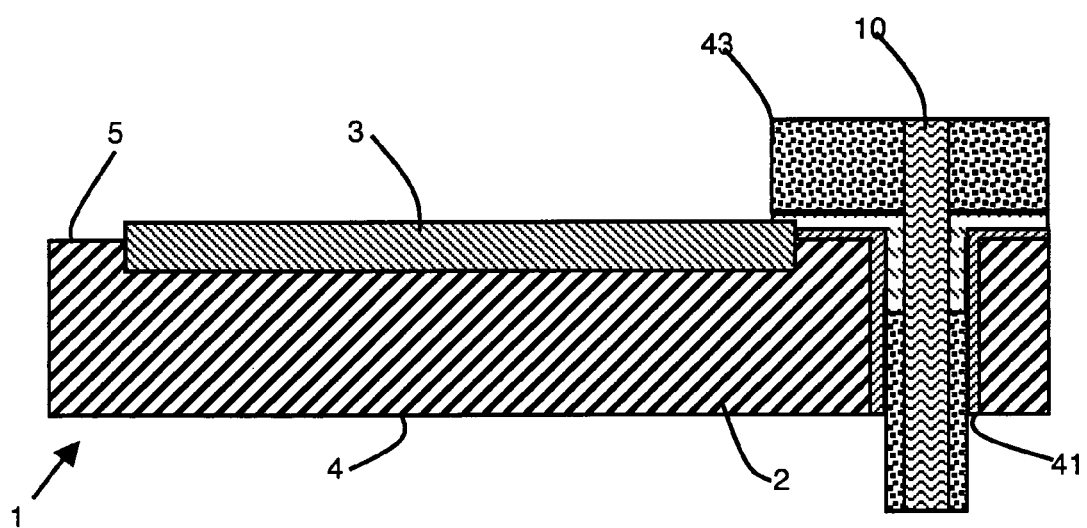

As illustrated in cross section in FIGS. 16 and 17, in the case of use of a conducting wire element 10, electrical insulation of the inside of holes 8, 9 is achieved by deposition, for example by PECVD, of an insulating material 41, for example silicon oxide or silicon nitride, with a typical thickness of about 1 to 3 µm. The layer of insulating material 41 is then patterned in known manner to enable access to contact pads connected to component 3 of microelectronic chip 1.

Deposition of a conducting material 42 is then performed, for example 30 nm of titanium covered by 300 nm of copper or a titanium/nickel bilayer. Conducting material 42 is then patterned so that the internal surface of the holes is electrically connected to component 3.

As before, deposition by electrolysis of a reinforcing metal 43 can advantageously be performed. The reinforcing metal will then cover wire element 10 and the contact areas with the chip thereby ensuring an enhanced mechanical strength. The thickness of metal layer 43 is typically in the 1-30 µm range, for example about 5 µm. Compared with other techniques, electrolysis presents the advantage of being performed cold and of not subsequently constituting a thermal limitation.

At least two chips 1 can be integrated on at least one wire element 10 so as to form a microstructure or an assembly. This assembly comprises chips each fixed to wire element 10, chips 1 being connected to one another by a wire element that constitutes a flexible mechanical support. In this assembly, recesses 8, 9 perform mechanical securing of microelectronic chip 1 on the wire elements which serve the purpose of electrical communication with the outside and power supply thereof.

The assembly can comprise a plurality of chips 1 organized in the form of a matrix of wire elements 10, 11 performing flexible mechanical connection of the different chips and advantageously electrical connection of the chips, in the two main directions of the matrix.

Chips 1 within the assembly can be supplied with power and/or communicate with one another or with the outside by means for example of at least one wire element made of conducting material or use an optic communication or communication via electromagnetic waves.

Once the assembly has been completed, the latter can be at least partially encapsulated by any suitable technique to protect it against aggressions by the outside environment and/or to achieve an enhanced mechanical strength. It can for example be encapsulated in a sheath able to be wound and/or unwound.

Several microelectronic chips 1, in particular according to FIGS. 1 and 2, can be integrated in a textile by securing between two adjacent same conducting wires so as to form a set of chips where each of the latter is associated with a particular function (energy source, energy recovery, numerical data processing, etc). Power supply can be performed by means of a chip metalized on the large faces thereof connected to an external generator for example by a system of grips and in contact with the supply threads of the textile. The chips can also in this case perform the same function (for example of pressure or temperature sensor). In this case, a chip according to FIG. 6 can be interposed between two sets of chips according to FIGS. 1 and 2 so as to connect the sets of chips to one another via a serial bus formed by wire 35. Wires 10 and 11 can then serve the purpose of energy supply. A thermoelectric power supply can also be envisaged.

Microelectronic chips according to FIG. 5 can be used for manufacturing a scintillating fabric. In this case, one of the elemental chips is a microbattery, and the other elemental chip is a device controlling the charge of this battery and a device that lights a diode as soon as an energy threshold is reached. Between the elemental chips, piezoelectric fibers perform energy recovery when movements of the fabric take place so as to recharge the battery. The microelectronic chips are inserted at the weaving stage, and the fabric starts to scintillate when it presents sufficient movements. A thermoelectric power supply can also be envisaged.

The chip can for example be a RFID (radio frequency identification device) component and the wires then constitute both antennas and power supply. These chips can for example be used for stock management.

Microelectronic chips according to the invention can in particular be used for making a screen fabric. In this case, one of the elemental chips is composed of a sapphire substrate on which a small matrix of multi-coloured light-emitting diodes is arranged (for example 16 by 16). The other elemental chip contains a storage and multiplexing software which retrieves the pixels to be displayed by means of a serial connection A holographic film is placed on the fabric so as to diffuse the light produced by the fabric.

The microelectronic component of the chips according to the invention can also be an actuator (for example an explosive or non-explosive gas generator). Addressing of such chips when the latter are assembled in chains is performed by one of the conducting threads of the textile. It is thereby for example possible to maintain an inflatable object (tire, balloon, boat) at constant pressure. Actuation can also be constituted by microactuators.

It is further possible to produce a tapestry constituting a man/machine interface or to form antennas for remote supply of sensors placed in a solid medium (concrete).

In all the fields using microelectronics, the devices have to be made as compact as possible. The invention can be used for this purpose by assembling chips vertically to constitute compact blocks but where inter-chip spaces can however be arranged (by means of the wire elements which keep the chips spaced apart) to improve cooling of the latter in operation.

The invention claimed is:

1. A microelectronic chip comprising:
   front and rear main faces,
   a first side face and a second side face, and
   a groove located at an outer peripheral surface of at least one of the front main face, the rear main face, the first side face or the second side face, the groove forming a housing for a wire element that constitutes an electrical connection by means of an electrical connection element,
   wherein the groove has an axis parallel to the face that contains the groove, the groove for fixing the wire element in the groove by clamping, the wire element constituting a flexible mechanical support for the chip, and
   wherein the groove extends along an entirety of the face that contains the groove.

2. The chip according to claim 1, wherein the chip further comprises an electrically conducting layer that at least partially coats the groove.

3. The chip according to claim 1, wherein the groove is situated on at least one of the first side face and the second side face.

4. The chip according to claim 3, wherein side faces of the grooves are structured in the form of claws.

5. The chip according to claim 1, wherein the groove is situated on at least one of the front main face and the rear main face.

6. The chip according to claim 5, wherein the groove is located on the rear main face, and an electrical contact passes through the chip from the front main face up to the groove.

7. The chip according to claim 5, wherein the groove is located on one of the front main face or the rear main face, and an electrical contact passes through the chip.

8. The chip according to claim 1, wherein the groove comprises a concave, square or circular cross section.

9. The chip according to claim 1, wherein the groove comprises a V-shaped or truncated V-shaped cross section.

10. The chip according to claim 9, wherein the chip further comprises a first and second elemental chip each comprising a small base and a large base that are parallel to one another and connected by at least one inclined flat side face forming an acute angle with the large base, the first and second elemental chips being secured to one another by their respective small bases so that their respective inclined flat side faces constitute the V-shaped or truncated V-shaped groove.

11. The chip according to claim 10, wherein the small base of each of the first and second elemental chips comprises an additional groove parallel to the V-shaped groove, the additional grooves of the first and second elemental chips being superposed to form an additional housing for the wire element.

12. The chip according to claim 1, wherein a plurality of notches are arranged on each side of the groove.

13. A fabrication method of a microelectronic chip according to claim 1, comprising
   fabricating simultaneously, on one and the same wafer, a plurality of elemental chips separated by V-shaped grooves each comprising two convergent walls,
   depositing an electrically conducting material forming, in each elemental chip, at least one contact arranged between a microelectronic component integrated in the elemental chip and a wall of an adjacent groove,
   assembling two wafers by their faces comprising the grooves so that the grooves are superposed, and
   cutting the assembled wafers at the level of the grooves.

14. A microstructure comprising at least one wire element connecting at least two chips according to claim 1, wherein the wire element simultaneously constitutes both an electrical connection and a flexible mechanical connection between the two chips.

15. The microstructure according to claim 14, wherein the wire element is glued in the grooves.

16. The microstructure according to claim 14, wherein the wire element is soldered in the grooves.

17. The microstructure according to claim 14, wherein the wire element is clamped in the grooves.

* * * * *